United States Patent
Bai et al.

(10) Patent No.: US 8,933,704 B2
(45) Date of Patent: Jan. 13, 2015

(54) CAPACITIVE LOAD TESTING DEVICE OF POWER SUPPLY

(71) Applicants: Hong Fu Jin Precision Industry (ShenZhen) Co., Ltd., Shenzhen (CN); Hon Hai Precision Industry Co., Ltd., New Taipei (TW)

(72) Inventors: Yun Bai, Shenzhen (CN); Fu-Sen Yang, Shenzhen (CN); Song-Lin Tong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 96 days.

(21) Appl. No.: 13/736,989

(22) Filed: Jan. 9, 2013

(65) Prior Publication Data

US 2013/0249567 A1    Sep. 26, 2013

(30) Foreign Application Priority Data

Mar. 26, 2012   (CN) .......................... 2012 1 0081335

(51) Int. Cl.
G01R 27/02      (2006.01)
G01R 27/26      (2006.01)
G06F 1/28       (2006.01)

(52) U.S. Cl.
CPC .............. G01R 27/2605 (2013.01); G06F 1/28 (2013.01)
USPC ........... 324/606; 323/223; 323/225; 307/109; 307/110; 324/684; 324/764.01

(58) Field of Classification Search
CPC .... G01R 27/2605; G01R 17/02; G01R 31/42; H02M 7/42; H02M 2007/00
USPC .................................... 324/606; 307/109, 110
See application file for complete search history.

(56) References Cited

U.S. PATENT DOCUMENTS

| | | | | |
|---|---|---|---|---|
| 5,397,999 A | * | 3/1995 | Kanamaru | 324/764.01 |
| 6,366,063 B1 | * | 4/2002 | Sekii | 323/223 |
| 7,057,397 B1 | * | 6/2006 | Davidson et al. | 324/606 |
| 7,528,506 B2 | * | 5/2009 | Lemke | 307/109 |
| 7,851,946 B2 | * | 12/2010 | Oyama et al. | 307/109 |
| 8,193,787 B2 | * | 6/2012 | Valenti et al. | 323/235 |
| 8,198,756 B2 | * | 6/2012 | Buter et al. | 307/110 |
| 8,212,420 B2 | * | 7/2012 | Okanobu | 307/109 |

(Continued)

FOREIGN PATENT DOCUMENTS

CN    101930025 A    12/2010

Primary Examiner — Benjamin M Baldridge
(74) Attorney, Agent, or Firm — Novak Druce Connolly Bove + Quigg LLP

(57) ABSTRACT

A device for testing capacitive loads of a power supply includes a controller, a power supply switching circuit, a capacitive load switching circuit, and a current sampling circuit. The power supply switching circuit selects one of output voltages of the power supply to be electronically connected to the capacitive load switching circuit and the current sampling circuit. The current sampling circuit samples an output current of one output of the power supply selected by the controller. The controller turns on and off switches of the capacitive load switching circuit for matching an output current of the power supply with a reference current until the output current equals to the reference current. The controller outputs a total magnitude of the capacitive loads.

10 Claims, 5 Drawing Sheets

(56) References Cited

U.S. PATENT DOCUMENTS

| | | | |
|---|---|---|---|
| 8,638,010 B2* | 1/2014 | Ly | 307/109 |
| 2009/0108681 A1* | 4/2009 | Litovsky | 307/110 |
| 2009/0160459 A1* | 6/2009 | De Langen et al. | 324/606 |
| 2011/0215654 A1* | 9/2011 | Kumar et al. | 307/109 |
| 2012/0007570 A1* | 1/2012 | Valenti et al. | 323/235 |
| 2012/0098553 A1* | 4/2012 | Karlsson et al. | 324/684 |
| 2012/0187774 A1* | 7/2012 | Tabatabaei et al. | 307/109 |
| 2013/0021190 A1* | 1/2013 | Sicard | 341/172 |

\* cited by examiner

CAPACITIVE LOAD TESTING DEVICE OF POWER SUPPLY

BACKGROUND

1. Technical Field

The present disclosure is related to a device for testing capacitive loads of a power supply.

2. Description of Related Art

A power supply unit (PSU) of a computer is a power supply having multiple outputs which may output voltages, +3.3V, +5V, +12V, for example. Each of the outputs of the PSU includes capacitive loads which equals to a capacitance value that can be connected to the PSU in parallel when the PSU turns on. When the capacitive loads, which are electronically connected to one of outputs of the PSU in parallel exceeds the largest capacitance value, the PSU may execute an over-current protection function which stops output the voltage of the PSU. Then, the computer cannot be operated or be turned on. When designing a main board of the computer, clearly understanding the largest capacitance value of each of the outputs of the PSU is very important.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present embodiments. Like item numbers denote like items in the various figures.

DETAILED DESCRIPTION

Figure 1:
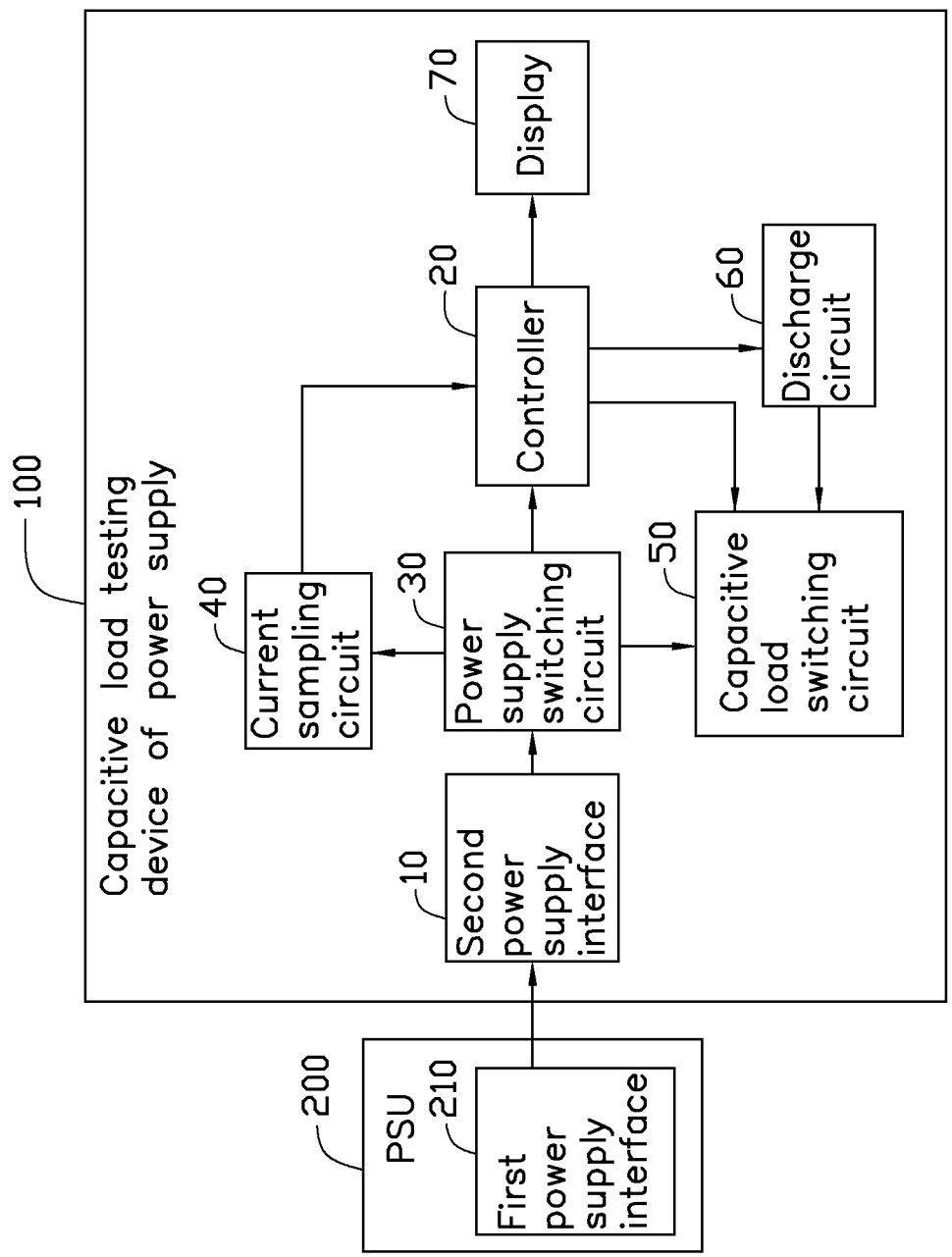
FIG. 1 is a functional module diagram of a capacitive load testing device of a power supply and a power supply unit of one embodiment.
Figure 2:
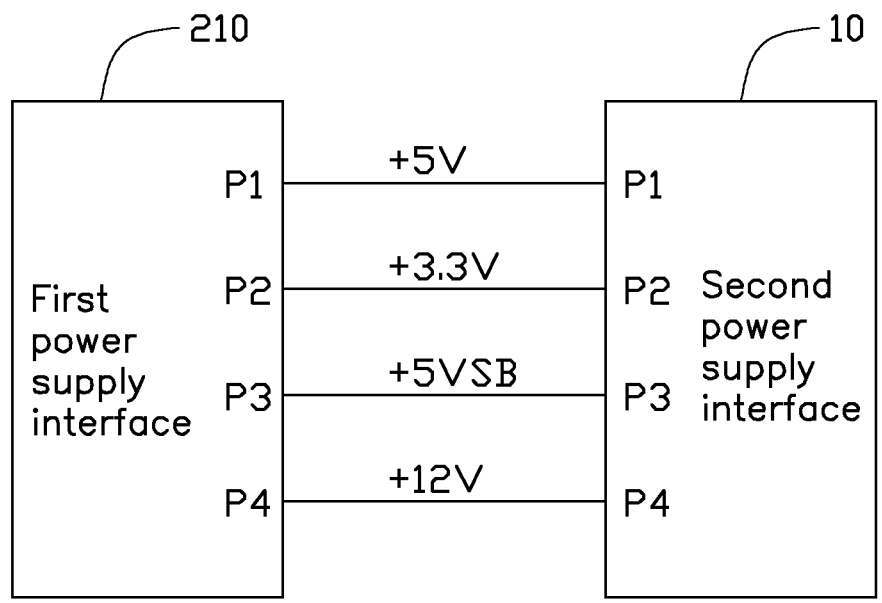
FIG. 2 is a connection schematic diagram of a first power supply interface of the power supply unit and a second power supply interface of the device of FIG. 1.

FIG. 1 and FIG. 2 are one embodiment of a capacitive load testing device 100 of the present disclosure. The capacitive load testing device 100 of a power supply determines a greatest capacitance value of an output power supply unit (PSU) 200. The PSU 200 is a multiple output power supply. The PSU 200 is used in conjunction with a computer to output multiple voltages for each power supply element of the computer. The multiple voltages may be +5V, +3.3V, +5V for backup, and +12V. The PSU 200 includes a first power supply interface 210. The capacitive load testing device 100 of the power supply includes a second power supply interface 10, a controller 20, a power supply switching circuit 30, a current sampling circuit 40, a capacitive load switching circuit 50, a discharge circuit 60, and a display 70.

FIG. 2 is a connection schematic diagram of the first power supply interface 210 and the second power supply interface 10 of the capacitive load testing device 100 of the power supply. The first power supply interface 210 includes a pin P1 for output +5V, a pin P2 for output +3.3V, a pin P3 for output +5V for backup, and a pin P4 for output +12V. The first power supply interface 210 is a power supply interface of twenty-four pins, and FIG. 2 shows four pins of twenty-four pins.

The second power supply interface 10 is electronically connected between the power supply switching circuit 30 of the capacitive load testing device 100 and the first power supply interface 210 of the PSU 200 to receive the multiple voltages, +5V, +3.3V, +5V for backup, and +12V. The second power supply interface 10 has a same structure as the first power supply interface 210 and includes a pin P1 for output +5V, a pin P2 for output +3.3V, a pin P3 for output +5V for backup, and a pin P4 for output +12V which are electronically connected to the pins of the first power supply interface 210.

Figure 3:
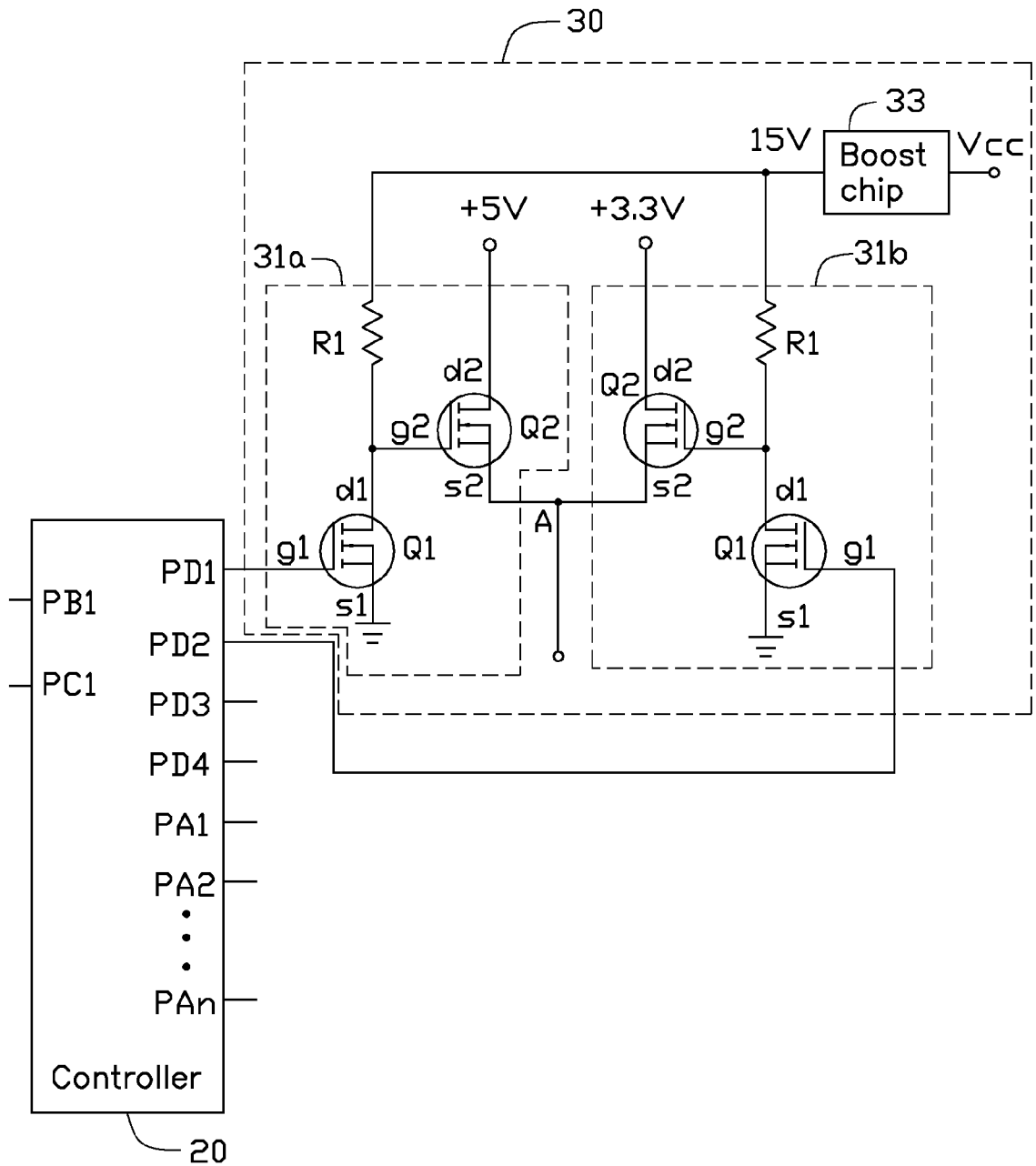
FIG. 3 is a circuit diagram of a power supply switching circuit and a controller of the device of FIG. 1.

FIG. 3 is a circuit diagram of the power supply switching circuit 30 and the controller 20 of the device 100. For electronically connecting one of the outputs of the PSU 200 with the capacitive load switching circuit 50, the controller 20 turns on one of switches of the power supply switching circuit 30. The controller 20 then controls the capacitive load switching circuit 50 to be electronically connected to the output of the PSU 200 for different capacitance values of the capacitive load. The controller 20 receives a current sampling by the current sampling circuit 40 and determines weather the capacitive load electronically connected to the PSU 200 is the largest capacitance value by the output current.

The controller 20 includes power supply switching pins PD1-PD4 electronically connected to the power supply switching circuit 30, capacitive loads switching pins PA1-PAn electronically connected to the capacitive load switching circuit, a sampling data updating pin PC1 electronically connected to the current sampling circuit 40, and a discharge controlling pin PB1 electronically connected to the discharge circuit 60.

The power supply switching circuit 30 includes a plurality of first switches. A number of the first switches is equal to a number of the outputs of the PSU 200. Two first switches 31a, 31b are shown in FIG. 3. Each of the first switches 31a, 31b includes an input contact, an output contact, and a control contact electronically connected to the controller 20. Each of the input contacts of the first switches 31a, 31b is electronically connected to one of the outputs of the PSU 200 by the second power supply interface 10. The output contacts of the first switches 31a, 31b are all electronically connected to the capacitive load switching circuit 50 and the current sampling circuit 40. The capacitive load switching circuit 50 and the current sampling circuit 40 are electronically connected or disconnected to one of the outputs of the PSU 200 according to the first switches turned on and off by the controller 20. The controller 20 turns on only one of the first switches at a time to separately test the outputs of the PSU 200.

In the embodiment, the power supply switching circuit 30 further includes a boost chip 33. The boost chip 33 converts an input voltage (e.g. +5V) into a drain voltage. The drain voltage is larger than each output voltage of the PSU 200. The drain voltage is +15V in the embodiment.

FIG. 3 shows two first switches 31a, 31b which are electronically connected to +5V of the PSU 200 and +3.3V of the PSU 200 separately and other switches are omissible. The first switch 31a includes a first Metal-Oxide-Semiconductor Field-Effect Transistor (MOSFET) Q1 and a second MOSFET Q2. A gate g1 of the first MOSFET Q1 is electronically connected to the switching pin PD1 of the controller 20, and a source s1 of the first MOSFET Q1 is grounded. A drain d1 of the first MOSFET Q1 is electronically connected to an output contact of the boost chip 33 to receive the drain voltage of +15V through a first pull-up resistor R1. A gate g2 of the second MOSFET Q2 is electronically connected to the drain d1 of the first MOSFET Q1. A drain d2 of the second MOSFET Q2 is electronically connected to the pin P1 for receiving the voltage of +5V output from the second power supply interface 10. A source s2 of the second MOSFET Q2 is electronically connected to the capacitive load switching circuit 50 and the current sampling circuit 40. The gate g1 of the first MOSFET Q1 is the control contact of the first switch 31a. The drain d2 of the second MOSFET Q2 is the input contact of the first switch 31a. The source s2 of the second MOSFET Q2 is the output contact of the first switch 31a. The other first switch 31b has a same structure as the first switch 31a, with the only differences being that the gate g1 of the first MOSFET Q1 of the first switch 31b is electronically connected to the switching pin PD2 of the controller 20, and the drain d2 of the second MOSFET Q2 of the first switch 31b is electronically connected to the pin P2 for receiving the voltage of +3.3V output from the second power supply interface 10. A node A of the first switches 31a and 31b is the output contact of the power supply switching circuit 30.

If the controller 20 need to test the output of +5V of the PSU 200, then the controller 20 outputs a low voltage signal (logic 0) to the gate g1 of the first MOSFET Q1 of the first switch 31a by the switching pin PD1 and output a high voltage signal (logic 1) to other first switches. The first MOSFET Q1 of the first switch 31a is turned off, and the second MOSFET Q2 of the first switch 31a is turned on. The first MOSFET Q1 of the first switch 31b is turned on, and the second MOSFET Q2 of the first switch 31b is turned off. When the other output of the PSU 200 needs to be tested, the first switch 31b for example, the controller 20 outputs the low voltage signal to the first switch 31b and outputs the high voltage signal to other first switches, and the output voltage of the node A is +3.3V.

Figure 4:
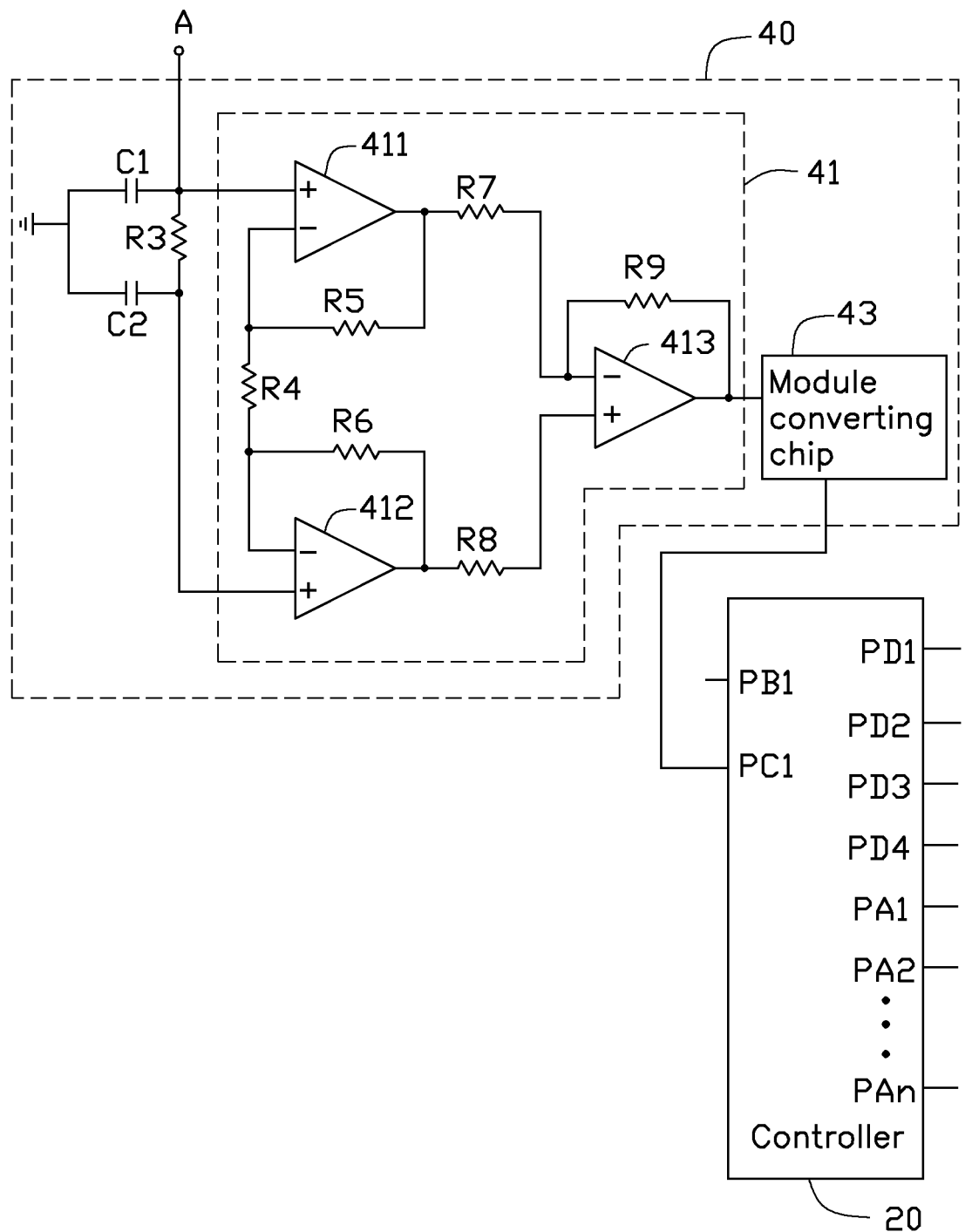
FIG. 4 is a circuit diagram of a current sampling circuit and the controller of the device of FIG. 1.

FIG. 4 is a circuit diagram of the current sampling circuit 40 of the device 100 and the controller 20. The current sampling circuit 40 samples the output current output from the power supply switching circuit 30 and the output current is selected by the controller 20. The current sampling circuit 40 includes a current detecting resistor R3, two filter capacitors C1 and C2, a voltage sampling amplification unit 41, and an analog-to-digital converter 43, which is an analog-to-digital converter and electronically connected to the voltage sampling amplification unit 41. The current detecting resistor R3 is connected to the output contact of the power supply switching circuit 30 in series in addition, is positioned between the node A and the capacitive load switching circuit 50 (shown in FIG. 5). One side of the current detecting resistor R3 is grounded through the filter capacitor C1, and the other side of the current detecting resistor R3 is grounded through the filter capacitor C2.

The voltage sampling amplification unit 41 detects a voltage across the current detecting resistor R3 and amplifies the voltage to output to the analog-to-digital converter 43. In the embodiment, the voltage sampling amplification unit 41 includes a first non-inverting amplifier 411, a second non-inverting amplifier 412, a differential amplifier 413, a gain set resistor R4, and resistors R5-R9. Non-inverting input contacts of the first non-inverting amplifier 411 and the second non-inverting amplifier 412 are electronically connected to two ends of the current detecting resistor R3 separately. Inverting input contacts of the first non-inverting amplifier 411 and the second non-inverting amplifier 412 are electronically connected to two ends of the gain set resistor R4. The output contact of the first non-inverting amplifier 411 is electronically connected to the inverting input contact of the differential amplifier 413 through the resistor R7. The output contact of the second non-inverting amplifier 412 is electronically connected to the non-inverting input contact of the differential amplifier 413 through the resistor R8. A resistor R5 is positioned between the input contact and the output contact of the first non-inverting amplifier 411. A resistor R6 is positioned between the input contact and the output contact of the second non-inverting amplifier 412. A resistor R9 is positioned between the input contact and the output contact of the differential amplifier 413. The first non-inverting amplifier 411 and the second non-inverting amplifier 412 are symmetrical non-inverting amplifiers, and separately amplify the voltages of the two ends of the current detecting resistor R3, and separately output the amplified voltages to the non-inverting input contact and the inverting input contact of the differential amplifier 413. The differential amplifier 413 amplifies a subtraction of the non-inverting input and the inverting input to output to the analog-to-digital converter 43. The gain set resistor R4 may adjust a gain of the voltage sampling amplification unit 41.

The analog-to-digital converter 43 converts an analog signal sampled by the voltage sampling amplification unit 41 into a digital signal and outputs to the sampling data updating pin PC1 of the controller 20. A value of the digital signal divided by the resistor value of the current detecting resistor R3 and the gain of the voltage sampling amplification unit 41 equals a value of the current output from the power supply switching circuit 30. The controller 20 compares the value of the output current with a reference current, and the reference current is a current value when the power supply executes the over-current protection, which stops output the voltage of the PSU 200.

Figure 5:
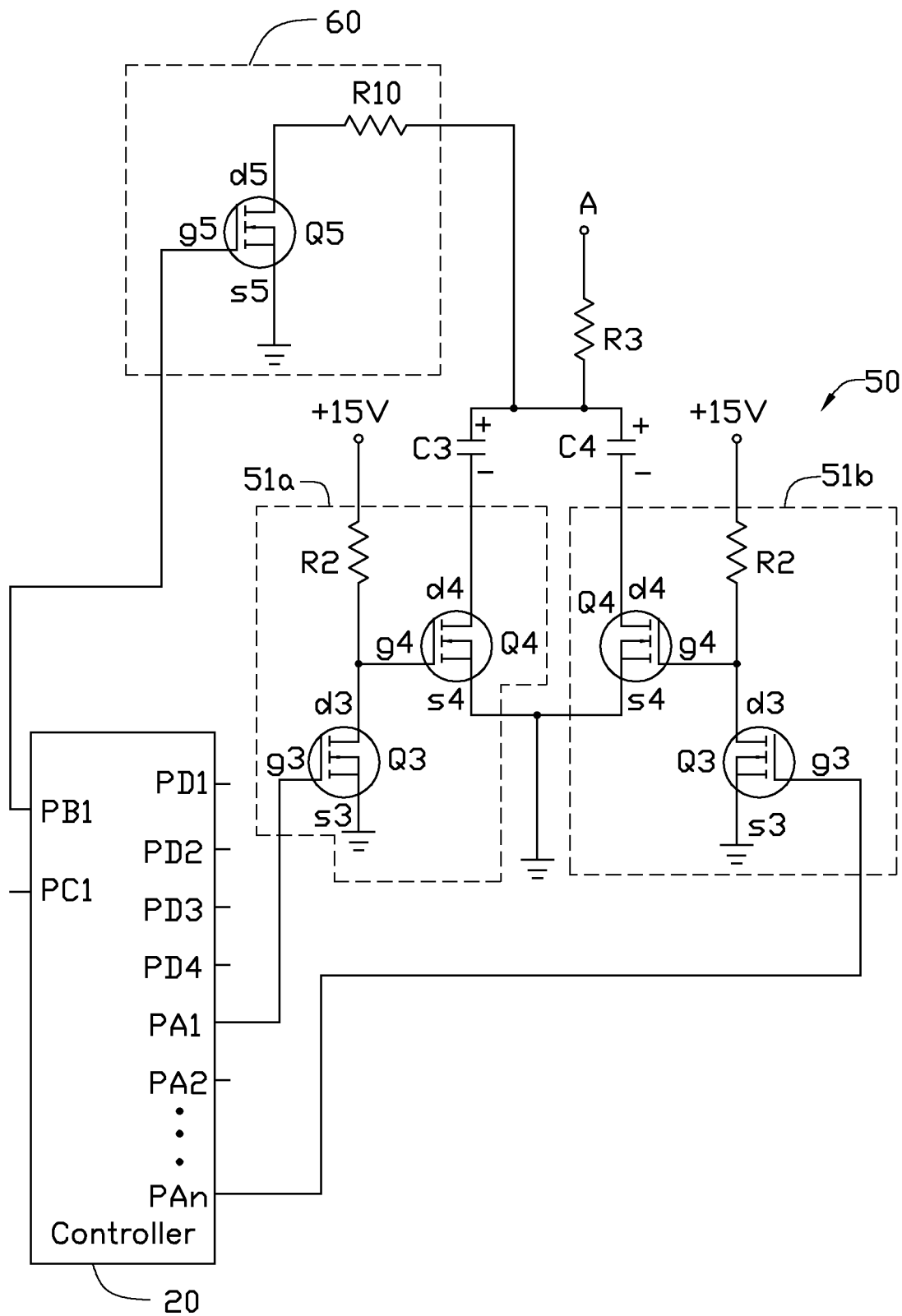
FIG. 5 is a circuit diagram of a capacitive load switching circuit, a discharge circuit and the controller of the device of FIG. 1.

FIG. 5 is a circuit diagram of the capacitive load switching circuit 50, the discharge circuit 60 of the device 100 and the controller 20. The capacitive load switching circuit 50 includes a plurality of second switches. A number of second switches is equal to a number of the capacitive load switching pins PA1-PAn of the controller 20 (two second switches 51a, 51b are shown in FIG. 5) and a plurality of loading capacitors. A number of loading capacitors is equal to a number of the second switches (two loading capacitors C3, C4 are shown in FIG. 5). Each of the second switches is electronically connected to the corresponding capacitive load switching pins PA1-PAn of the controller 20. Each anode of the each loading capacitor is electronically connected to the output contact of the power supply switching circuit 30 through the current detecting resistor R3, and each cathode of the each loading capacitor is grounded through the second switch. Different total magnitudes of the capacitive loads are connected to the power supply according to the controller 20 turning on and off the second switches.

In FIG. 5, the two second switches 51a, 51b and the two loading capacitors C3, C4 are examples. The second switch 51a includes a third MOSFET Q3 and a fourth MOSFET Q4. A gate g3 of the third MOSFET Q3 is electronically connected to the capacitive load switching pin PA1 of the controller 20. A drain d3 of the third MOSFET Q3 is electronically connected to the output contact of the boost chip 33 for receiving the drain voltage of +15V through a second pull-up resistor R2. A source s3 of the third MOSFET Q3 is grounded. A gate g4 of the fourth MOSFET Q4 is electronically connected to the drain d3 of the third MOSFET Q3. A drain d4 of the fourth MOSFET Q4 is electronically connected to the output contact of the power supply switching circuit 30 through the loading capacitor C3. A source s4 of the fourth MOSFET Q4 is grounded. The second switch 51b has the same structure as the second switch 51a, with the differences being that the gate g3 of the third MOSFET Q3 of the second switch 51b is electronically connected to the capacitive load switching pin PAn of the controller 20 and the drain d4 of the fourth MOSFET Q4 of the second switch 51*b* is electronically connected to the output contact of the power supply switching circuit 30 through the loading capacitor C4.

When the controller 20 tests capacitive loads of the power supply, +5V of the power supply for example, the controller 20 output the low voltage signal output from the capacitive load switching pin PA1 to turn on the second switch 51*a*, and the loading capacitor C3 is connected to the +5V of the power supply. If a value of the current output from the +5V of the power supply is smaller than the reference current value, then the controller 20 turns on the other second switches for increasing the capacitance value of the capacitive load switching circuit 50 until the output current value equals to the reference current value. In addition, the total capacitance value of the capacitive load switching circuit 50 is the largest capacitance value of the +5V of the power supply. The controller 20 calculates the total capacitance value of the capacitive load switching circuit 50 according to the capacitance value corresponding to the second switches.

The capacitance value of the filter capacitors C1 and C2 are preferably smaller than one nanofarad, and the current detecting resistor value is preferably smaller than 0.1Ω to avoid influencing the accuracy of the largest capacitance value calculated by the controller 20. In the embodiment, the capacitance value of the filter capacitor is one nanofarad, and the current detecting resistor value is 0.04Ω.

The discharge circuit 60 is electronically connected to the controller 20 and discharges the loading capacitors to raise the accuracy after testing the largest capacitive load of the power supply. The discharge circuit 60 includes a fifth MOSFET Q5 and a discharge resistor R10. A gate g5 of the fifth MOSFET Q5 is electronically connected to the discharge controlling pin PB1 of the controller 20, and a drain d5 of the fifth MOSFET Q5 is electronically connected to the anodes of the loading capacitors through discharge resistor R10. When the test of one of the output of the PSU 200 is finished, the controller 20 transmits the low voltage signal output from the discharge controlling pin PB1 to the fifth MOSFET Q5 and the discharge resistor is grounded to discharge electronic charges of the loading capacitors C3, C4. The discharge circuit 60 further includes a plurality of fifth MOSFETs and discharge resistors to avoid a larger current damaging the fifth MOSFET Q5. Each gate of the fifth MOSFETs is electronically connected to the discharge controlling pin PB1 of the controller 20, and each source of the fifth MOSFETs is grounded, and each drain of the fifth MOSFETs is electronically connected to the anode of the loading capacitors through one of discharge resistors. When the discharge circuit is discharged, the discharge resistors may separate the current for reducing damage of the MOSFETs.

The display 70 is electronically connected to the controller 20 and displays the largest value of the capacitive loads of each of the outputs of the PSU 200 determined by the controller 20.

The capacitive load testing device 100 of the power supply tests the largest value of the capacitive loads of one of the outputs of the PSU 200 by the power supply switching circuit 30. The controller 20 turns on and off the switches of the capacitive load switching circuit 50 for determining the largest total value of the capacitive loads of the PSU 200. Therefore, the capacitive load testing device 100 of power supply may clearly test the largest value of the capacitive loads of each of the outputs of the PSU 200.

It is to be further understood that even though numerous characteristics and advantages of the present embodiments have been set forth in the foregoing description, together with details of structures and functions of various embodiments, the disclosure is illustrative only, and changes may be made in detail, especially in matters of arrangement of parts within the principles of the present disclosure to the full extent indicated by the broad general meaning of the terms in which the appended claims are expressed.

What is claimed is:

1. A device for testing a largest capacitive load value of a power supply, the device comprising:
   a controller electronically connected to the power supply, a power supply switching circuit, a capacitive load switching circuit, a current sampling circuit;
   wherein the power supply switching circuit selects one output of the power supply to be electronically connected to the capacitive load switching circuit and the current sampling circuit, causing the power supply switching circuit to be electronically connected to the power supply, the capacitive load switching circuit, and the current sampling circuit;
   wherein the capacitive load switching circuit comprises a plurality of capacitive loads;
   wherein the controller receives from the current sampling circuit a sample of a current of the one output of the power supply; and
   wherein the controller controls the capacitive load switching circuit to selectively provide at least one capacitive load of the plurality of capacitive loads to be electronically connected to the power supply in parallel, and the controller compares the sampled current of the one output of the power supply with a reference current until a value of the said sampled current of the one output of the power supply equaling a value of the reference current is reached, and the controller outputs a total value of the at least one capacitive load.

2. The device of claim 1, wherein the power supply switching circuit comprises a plurality of first switches, wherein a number of the first switches equal to a number of the outputs of the power supply, and each of the first switches comprises an input contact, an output contact, and a control contact electronically connected to the controller, and each of the input contacts of the first switches is electronically connected to the output of the power supply, and the output contacts of the first switches are electronically connected to the capacitive load switching circuit and the current sampling circuit, wherein the controller turns the first switches on and off.

3. The device of claim 2, wherein each of the first switches comprises a first Metal-Oxide-Semiconductor Field-Effect Transistor (MOSFET) and a second MOSFET, and wherein a gate of the first MOSFET is electronically connected to the controller, and a source of the first MOSFET is grounded, and a drain of the first MOSFET is electronically connected to a drain voltage, wherein the drain voltage is larger than the largest output voltage of the power supply, wherein a gate of the second MOSFET is electronically connected to the drain of the first MOSFET, and a drain of the second MOSFET is electronically connected to one of the output of the power supply, and a source of the second MOSFET is electronically connected to the capacitive load switching circuit and the current sampling circuit.

4. The device of claim 3, wherein the power supply switching circuit further comprises a boost chip, and an input contact of the boost chip is electronically connected to the output of the power supply, and an output contact of the boost chip is electronically connected to each of the drains of the first MOSFETs of the first switches, and wherein the boost chip converts the output voltage of the power supply to the drain voltage.

5. The device of claim 1, wherein the capacitive load switching circuit comprises a plurality of second switches, wherein a number of second switches is equal to a number of the capacitive loads, and each of the second switches is electronically connected to the controller, and each anode of the capacitive loads is electronically connected to the output contact of the power supply switching circuit, and cathodes of the capacitive loads are grounded through the second switches, wherein the controller controls the capacitive loads to be electronically connected and disconnected to the power supply by turning on and off the second switches.

6. The device of claim 5, wherein each the second switches comprises a third MOSFET and a fourth MOSFET, wherein a gate of the third MOSFET is electronically connected to the controller, and a drain of the third MOSFET is electronically connected to the drain voltage, and a source of the third MOSFET is grounded, wherein a gate of the fourth MOSFET is electronically connected to the drain of the third MOSFET, and a drain of the fourth MOSFET is electronically connected to the output of the power supply switching circuit through a capacitive load, and a source of the fourth MOSFET is grounded.

7. The device of claim 1, wherein the current sampling circuit comprises a current detecting resistor, a voltage sampling amplification unit, and an analog-to-digital converter, wherein the current sampling circuit is electronically connected between the output contact of the power supply switching circuit and the capacitive load switching circuit in series, wherein the voltage sampling amplification unit detects a voltage across the current detecting resistor and outputs a voltage amplified by the voltage sampling amplification unit to the analog-to-digital converter, wherein the analog-to-digital converter converts an analog value of voltage into a digital value of voltage and outputs the digital value of voltage to the controller, wherein the digital voltage value is divided by a current detecting resistor value and a gain of the voltage sampling amplification unit by the controller thereby calculating an output current of the power supply.

8. The device of claim 1, wherein the voltage sampling amplification unit comprises a first non-inverting amplifier, a second non-inverting amplifier, a differential amplifier, and a gain set resistor, wherein a non-inverting input contact of the first non-inverting amplifier is electronically connected to one end of the current detecting resistor, and a non-inverting input contact of the second non-inverting amplifier is electronically connected to the other end of the current detecting resistor, wherein an inverting input contact of the first non-inverting amplifier is electronically connected to one end of the gain set resistor, and an inverting input contact of the second non-inverting amplifier is electronically connected to the other end of the gain set resistor, wherein an output contact of the first non-inverting amplifier is electronically connected to an inverting input contact of the differential amplifier, and an output contact of the second non-inverting amplifier is electronically connected to an non-inverting input contact of the differential amplifier, wherein the first non-inverting amplifier and the second non-inverting amplifier are symmetrical non-inverting amplifiers and amplify voltages of the both ends of the current detecting resistor and transmit amplified voltages to the inverting and non-inverting input contacts of the differential amplifier, wherein the differential amplifier amplifies a subtraction of a voltage of the inverting input contact and a voltage of the non-inverting input contact to transmit an amplified subtraction to the analog-to-digital converter.

9. The device of claim 1, further comprising a discharge circuit, wherein the discharge circuit comprises a fifth MOSFET and a discharge resistor, wherein a gate of the fifth MOSFET is electronically connected to the controller, and a source of the fifth MOSFET is grounded, and a drain of the fifth MOSFET is electronically connected to each anode of the capacitive loads through the discharge resistor, wherein the controller turns on the fifth MOSFET for discharging electric charges of each capacitive load through the discharge resistor after detecting the largest value of the capacitive load of the each of the outputs of the power supply.

10. The device of claim 1, further comprising a first power supply interface electronically connected to the power supply, and a second power supply interface is electronically connected the power supply switching circuit, wherein the first power supply interface and the second power supply interface are electronically connected, wherein the power supply switching circuit receives a plurality of output voltages of the power supply through the first power supply interface and the second power supply interface.

* * * * *